(12) United States Patent
Lin (10) Patent No.: US 7,211,811 B2
(45) Date of Patent: May 1, 2007

(54) METHOD FOR PREVENTING WAFER SURFACE FROM BOMBARDMENT BY MICRO-DUST PARTICLES DURING THE ION IMPLANTATION PROCESS

(75) Inventor: Wei-Cheng Lin, HsinChu County (TW)

(73) Assignee: Advanced Ion Beam Technology Inc., Hsinchu City (TW)

( * ) Notice: Subject to any disclaimer, the term of this patent is extended or adjusted under 35 U.S.C. 154(b) by 0 days.

(21) Appl. No.: 11/176,245

(22) Filed: Jul. 8, 2005

(65) Prior Publication Data

US 2006/0006347 A1   Jan. 12, 2006

Related U.S. Application Data

(60) Provisional application No. 60/585,837, filed on Jul. 8, 2004.

(51) Int. Cl.
*H01J 37/317* (2006.01)
*G21K 5/10* (2006.01)

(52) U.S. Cl. .............. 250/492.21; 250/492.2; 250/398

(58) Field of Classification Search ............ 250/400
See application file for complete search history.

(56) References Cited

U.S. PATENT DOCUMENTS

| 4,672,210 | A | * | 6/1987 | Armstrong et al. ...... 250/492.2 |
| 4,745,287 | A | * | 5/1988 | Turner ...................... 250/492.2 |
| 4,965,862 | A | * | 10/1990 | Freytsis et al. ......... 250/453.11 |
| 5,124,557 | A | * | 6/1992 | Aitken .................. 250/442.11 |
| 5,670,217 | A | | 9/1997 | Blake et al. |
| 6,806,479 | B1 | * | 10/2004 | Wan et al. ............. 250/492.21 |

* cited by examiner

*Primary Examiner*—Nikita Wells
(74) *Attorney, Agent, or Firm*—Bacon & Thomas, PLLC (57) ABSTRACT

A method for preventing wafer surface from bombardment by micro-dust particles during the ion implantation process is disclosed. The method adjusts, in mobile way, the rotation direction of the rotating disk system in association with the inclined direction of the wafer to make the ion-implanting surface, having deep micro-size circuit structure, of the wafer never face the bombardment by the micro-dust particles during the rotation of the rotating disk system. The method includes: adjusting the rotating direction of the rotating disk into clockwise direction when it comes to performing an implantation at positive inclined angle; and adjusting the rotating direction of the rotating disk into counter-clockwise direction when it comes to performing an implantation at negative inclined angle. In this way, the ion-implanting surface of the wafer will never be bombarded by the micro-dust particles.

4 Claims, 10 Drawing Sheets

FIG. 1
PRIOR ART

PR Wafer pre-count

PR Wafer post-count

→ Picture 1,2

→ Picture 3,4

→ Picture 5

→ Picture 6

→ Picture 7

Picture 8

METHOD FOR PREVENTING WAFER SURFACE FROM BOMBARDMENT BY MICRO-DUST PARTICLES DURING THE ION IMPLANTATION PROCESS

CROSS-REFERENCE TO RELATED APPLICATION

This application claims the benefit of the following U.S. Provisional Application, which is herein incorporated by reference for all intents and purposes.

| Ser. No. | FILING DATE | TITLE |
| --- | --- | --- |
| 60/585,837 | Jul. 8, 2004 | METHOD FOR PREVENTING WAFER DEFECT FOR A BATCH-TYPE ION IMPLANTER SPINNING DIRECTION PARTICLE |

BACKGROUND OF THE INVENTION

1. Field of the Invention

The invention relates to an ion implantation method used in the manufacturing of semiconductor IC (integrated circuit), and more particularly, relates to a method for preventing wafer surface from bombardment by micro-dust particles during the ion implantation process.

2. Description of the Prior Art

The semiconductor, during its manufacturing process, utilizes the ion implantation process for doping the dopant atom into the semiconductor. During the manufacturing process of IC, the ion implanter, with its ion beam, treats wafer in performing the doping of N-type or P-type of extrinsic dopant atom or forming passivation layer. While performing semiconductor doping, the ion implanter injects the ions selected to generate desired extrinsic dopant. The use of Antimony, Arsenic, or Phosphorus as ion source materials can form N-type doping wafer while the use of Boron, Boron-diflouride or Indium as ion source materials can form P-type doping wafer.

Conventional ion implanter includes an ion source that utilizes a self-ionized ion source material to generate positive-charged ions that form into an ion beam to reach an implanting station through a predetermined ion-beam path. The ion implanter can includes also a structure for forming ion beam between the ion source and the implanting station to maintain and restrain the ion beam. High degree of vacuum state is required during the operation in order to lower the chance that the ion beam might bombard the air particles causing the deviation from the predetermined path of the ion beam.

The [mass/charge] ratio of the ion will affect the extent of being accelerated in axial or longitudinal direction in the electrical or magnetic fields. The ions not used for implantation will be screened out since the mass of the ions not used for implantation will deviate the pre-determined ion beam path, thereby, the ion beam can have high degree of pureness as they reach the target wafer. This kind of process for separating the desired and non-desired ions for implantation is called mass analysis, and the device for this separating or screening purpose is called a mass analyzer. The conventional mass analyzer includes an analyzing magnet for generating a magnetic field. The various ions in the ion beam under the magnetic field will turn in different degree of direction in accordance with their [mass/charge] ratio, thereby, will make the desired and non-desired ions for implantation effectively separated.

There are two kinds of ion implanter, i.e. the sequential type and the batch type. The sequential type of ion implanter includes a single workpiece carrier, and the ion implantation is accomplished sequentially, one workpiece at a time. In batch-type of ion implantation, a plurality of workpieces are loaded on a plurality of wafer loading pads of a single rotating disk system, and the ion implantation of a plurality of workpieces are accomplished in one implanting operation. These wafer-loading pads are mounted on the plurality of supporting pads of the supporting stand extended from the center of the rotating disk. These supporting seats have an inclination for avoiding the channeling effect during the process of ion implantation. The wafer secures in position on the wafer-loading pad through the centrifugal force while the rotating disk rotates by the driving motor. The rotating disk rotates in a single direction and accommodates one-dimensional and reciprocating linear movement such that the ion beam can uniformly implant into the wafer. Heat will generate while the ion beam bombards the wafer, thus cooling liquid going through the inner tube for dissipating the heat is often utilized to prevent the wafer from being damaged.

Performing ion implantation can generates some contaminant particles, of which one of the sources is the residual ion source's particles from the ion implantation performed last time. Other source of contaminant particles is the photoresist that covers on the wafer surface for defining circuit. As the ion beam bombards the wafer surface, the particle of the photoresist will sever. These deep micro-size particles, affected primarily by the electrostatic force, move to-and-fro, collide, and rebound amid the evacuated space of the ion implanter. In the process of manufacturing semiconductor having circuit of deep micro level, these particles can collide and adhere to the wafer surface resulting in becoming the primary source of high defective rate.

U.S. Pat. No. 5,670,217 discloses a method of capturing and removing contaminant particles from an interior region of an ion implanter. The method includes: providing a particle collector having a particle adhering surface to which contaminant particles readily adhere; securing the particle collector to the implanter such that the particle adhering surface of the collector is positioned within the evacuated interior region at a location near the ion travel path; and removing the particle collector from the ion beam implanter at periodic time interval to remove particles adhering to the collector from the evacuated interior region of the implanter. The method, besides using the material having passive adhering ability for the particle collector, also includes the use of the material such as electret fibers that can actively attract and secure the particles into the interior region of the particle collector by electrostatic attraction. The method also uses a partially cured elastomer to be a material for securing the particle collector to an inner wall of the ion implanter.

The preferred embodiment of the prior art utilizes a kind of aluminum foam sold under the designation Duoeel (Registered Trademark) to be a material for securing the particle collector. The aluminum foam material has been used in the prior art as a construction material where high mechanical strength is required but where lightweight construction materials are necessary. In addition, the aluminum foam material has a lot of irregularities and mutually communicative apertures with a high surface area. As a consequence, the contaminant particles have great chance to enter the aluminum foam material but rarely have chance to escape under appropriate condition, thereby, the particle collector can bring its capability into full play for capturing the contaminant particles.

The aluminum foam material is available in a variety of porosity. A foam material sheet that is too porous will not work because particles would simply pass through it, bounce off the walls of the ion implanter and again pass through the foam material sheet. This will result in its inability to have the capturing function. On the other hand, a foam material sheet with too little porosity, i.e. very high in density, will reflect many particles from its front surface, thereby, will not completely capture the contaminant particles.

The aluminum foam material can utilize the type of mechanical work to form cylindrical shape having the bore size that can contain the ion beam and that can become a portion of ion-beam neutralization apparatus or electron shower. The ion beam will capture a portion of the contaminant particles that advance along the peripheral edge of the ion beam, and consequently enter the ion-beam neutralization apparatus. These contaminant particles, after entering the cylindrical-shaped aluminum-foam material sheet, will collide with it. Consequently, the aluminum-foam material sheet will capture these contaminant particles.

Figure 1:
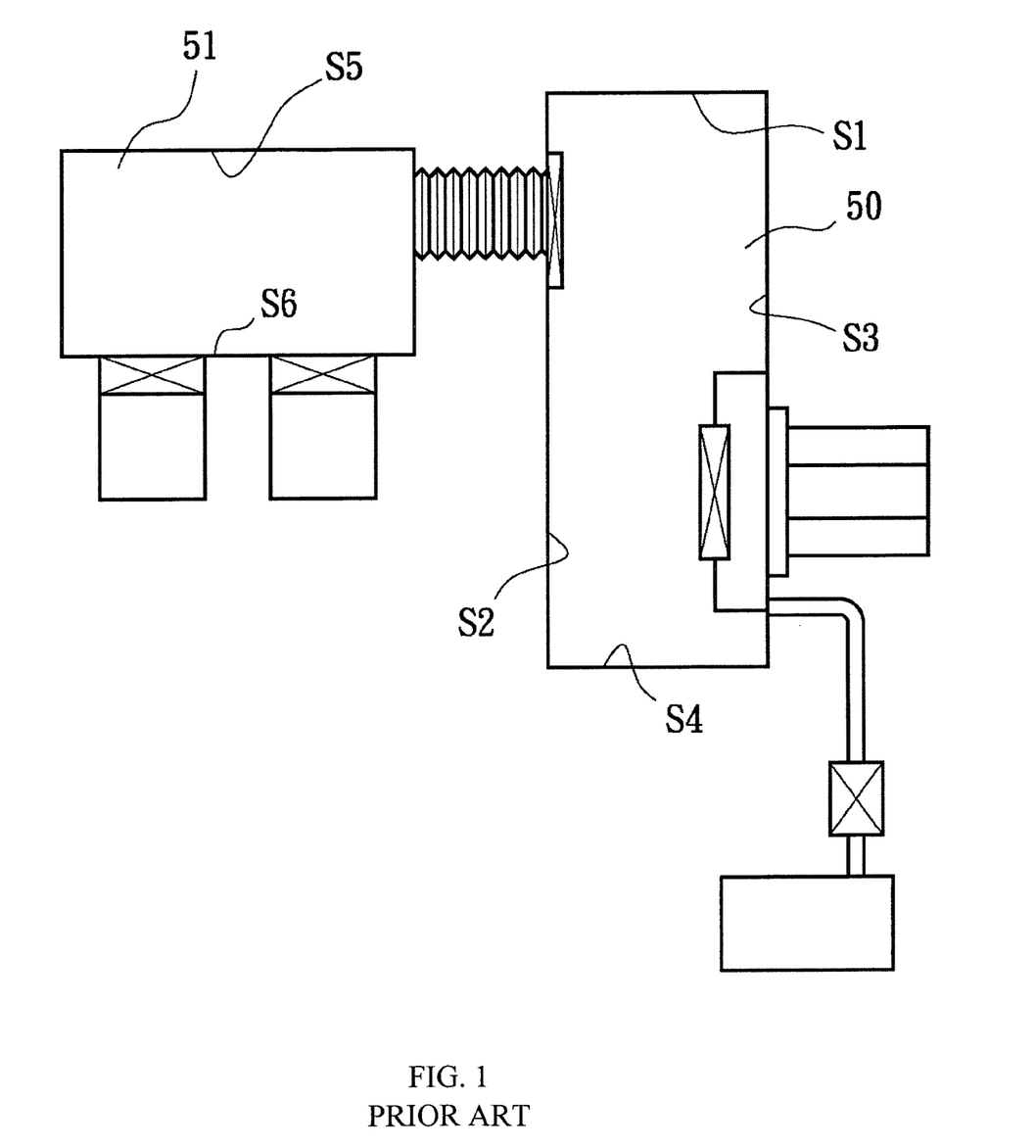
FIG. 1 is a location diagram of a planar aluminum foam sheet, which is used as particle collector, installed in interior region of an ion implanter of a prior art.

FIG. 1 is a location diagram of a planar aluminum-foam material sheet, which is used as particle collector, installed in interior region of an ion implanter of a prior art. One can also uses a planar aluminum foam sheet with appropriate porosity and thickness to install, with appropriate configuration, at locations S1 through S6 shown in FIG. 1. Among them, S1 through S4 are installed on the interior region of the ion-implanting chamber (50). However, S5 and S6 are installed in a Quadrupole magnet set for adjusting the height of the ion beam, a Farady Flag for measuring the characteristics of the ion beam, as well as the interior surface of a resolving housing (51) such as the ion-beam neutralization apparatus. The installation of the planar aluminum-foam material sheet in the embodiment utilizes a room temperature cured vulcanized silicone adhesive to apply to the interior surface of the ion implanter and the aluminum-foam material sheet is then applied to the treated surface. This process has been found to adequately secure the sheet within the implanter without producing contaminant particles inside.

The fact that the prior art needs to remove the particle collector from the implanter after a predetermined period-of-time and to install a new one is not convenient for one to use. Besides, the prior art, being subjected to electrostatic force, is mainly designed in light of the deep micro-size particles that travel through, collide with, and rebound in an evacuated interior region of the ion implanter.

Figure 21:
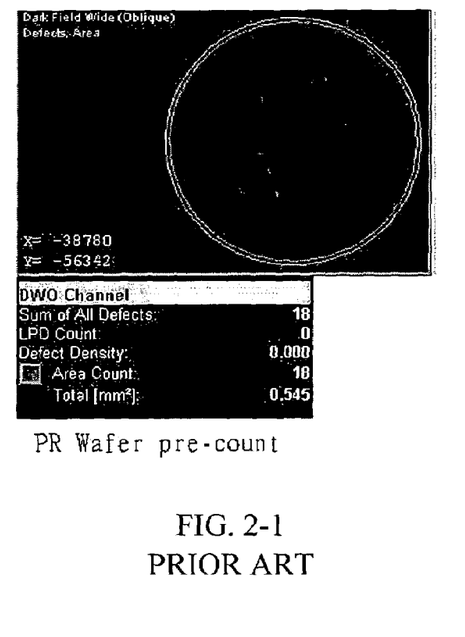
Figure 22:
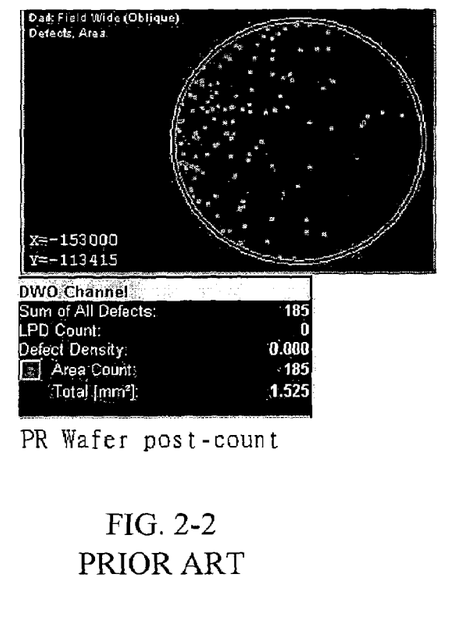
Figure 23:
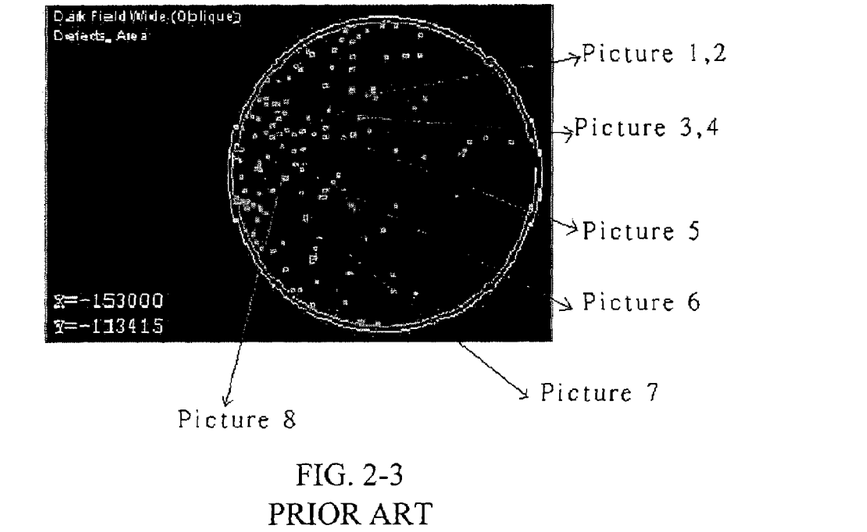
Figure 31:
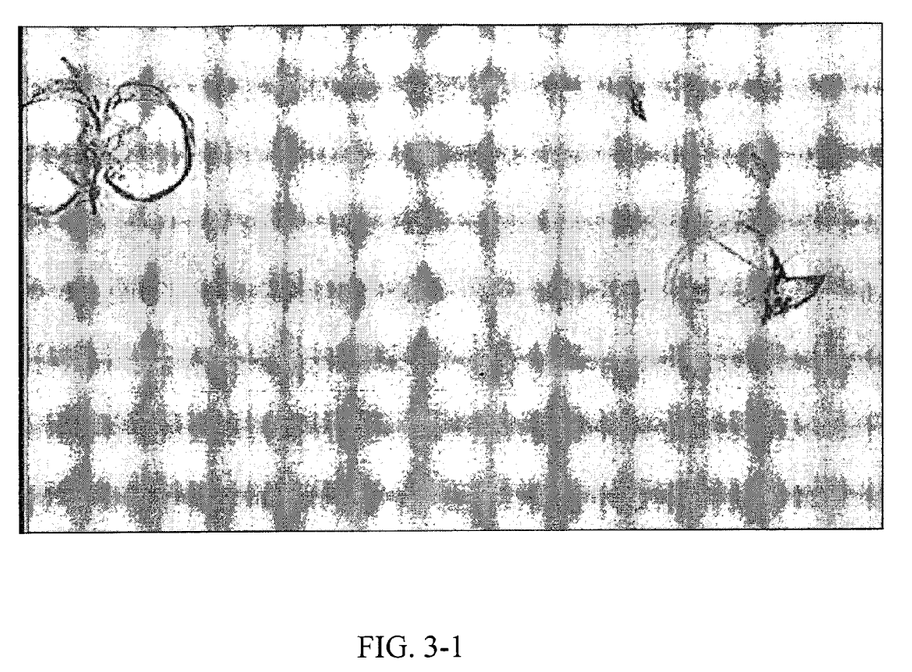
Figure 32:
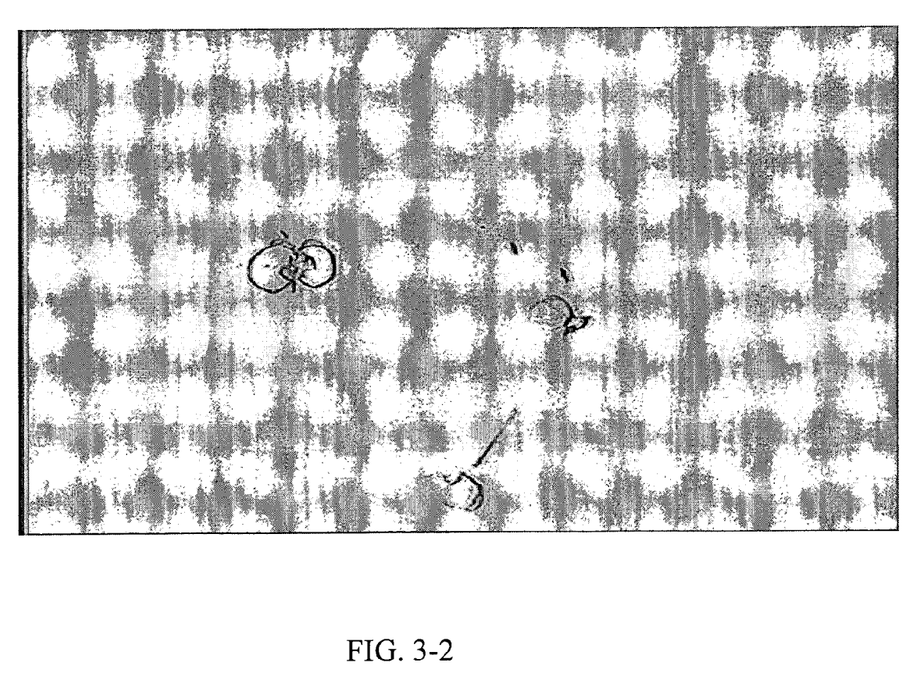
Figure 33:
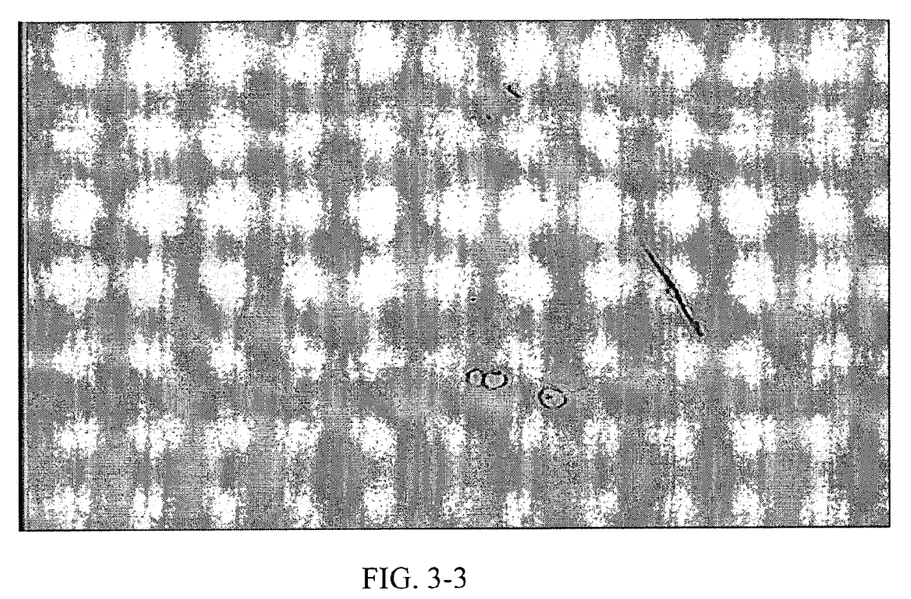
Figure 34:
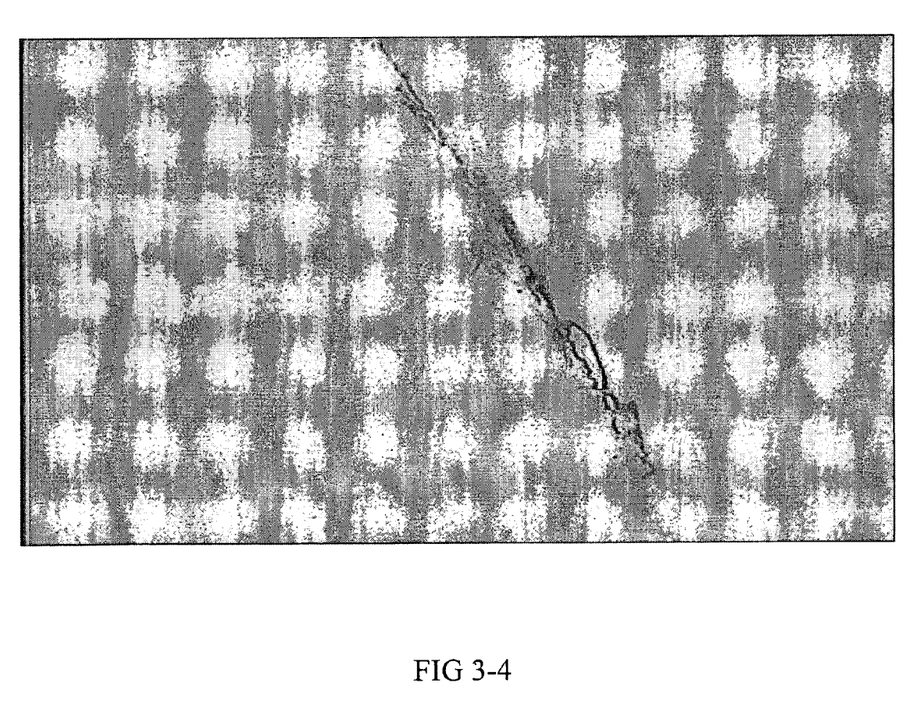
Figure 35:
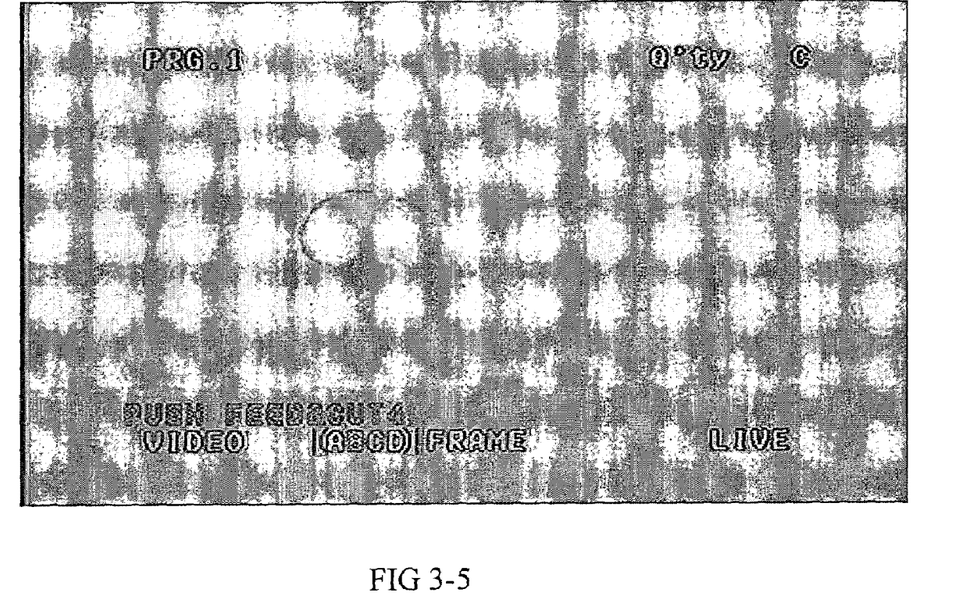
Figure 36:
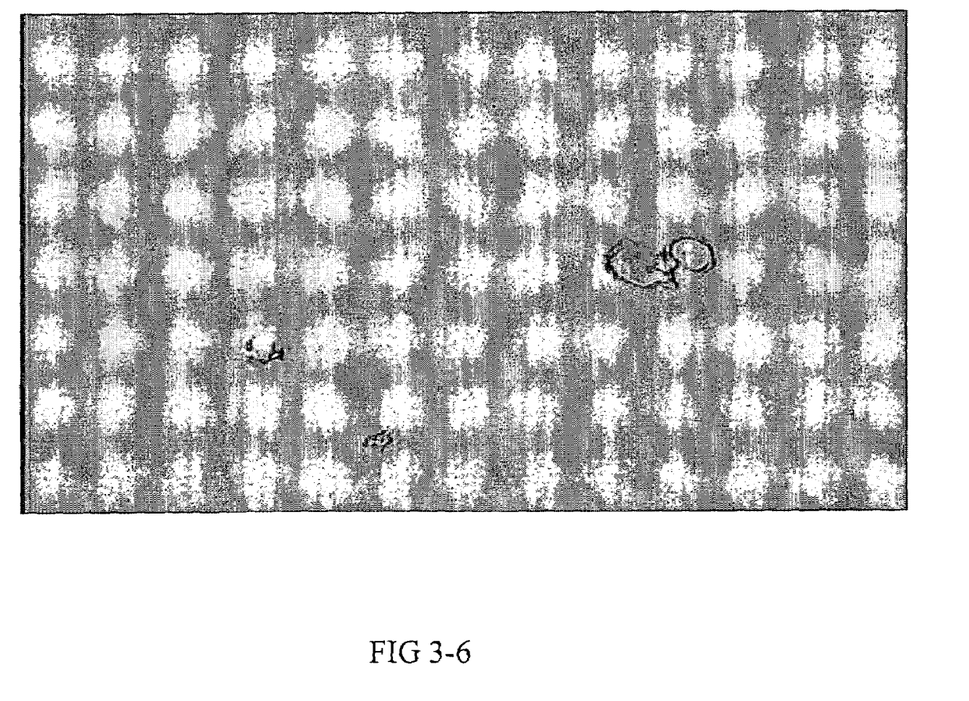
Figure 51:
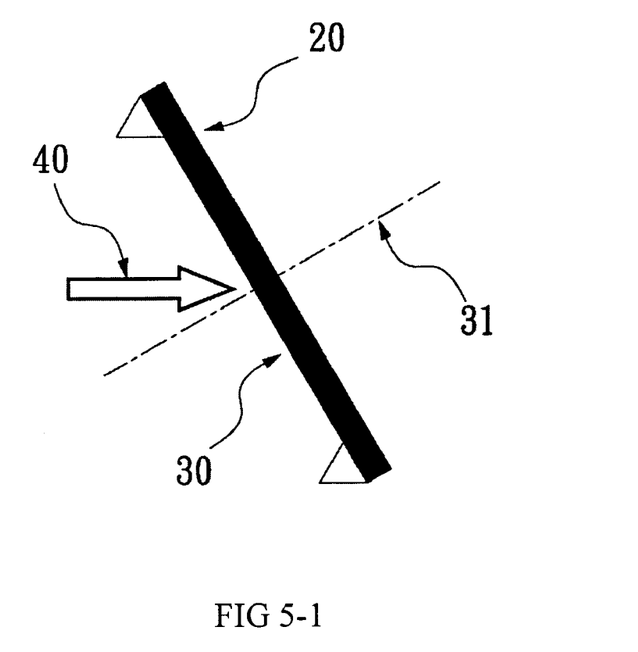
Figure 52:
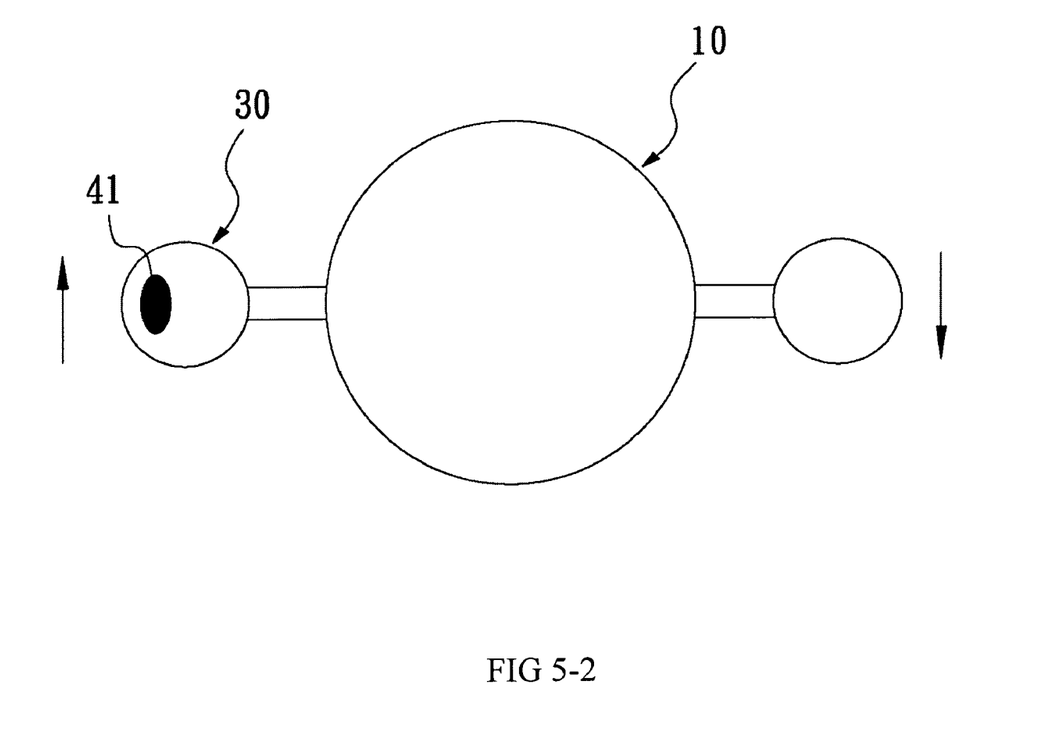
Figure 61:
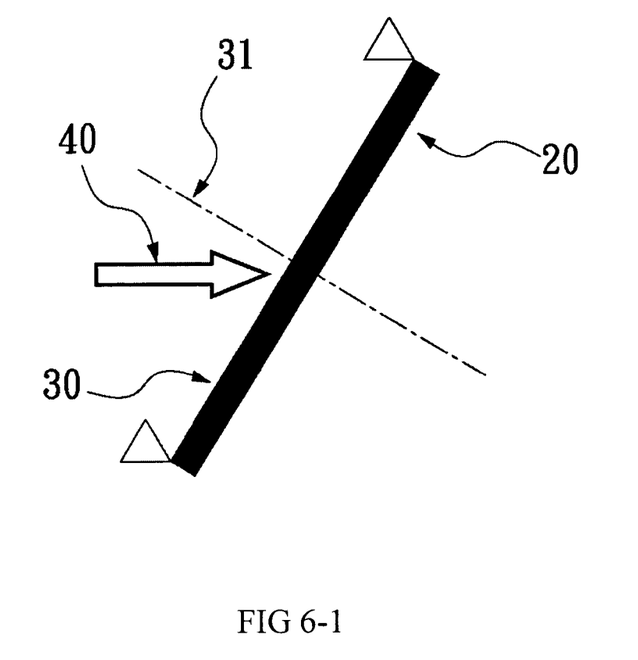
Figure 62:
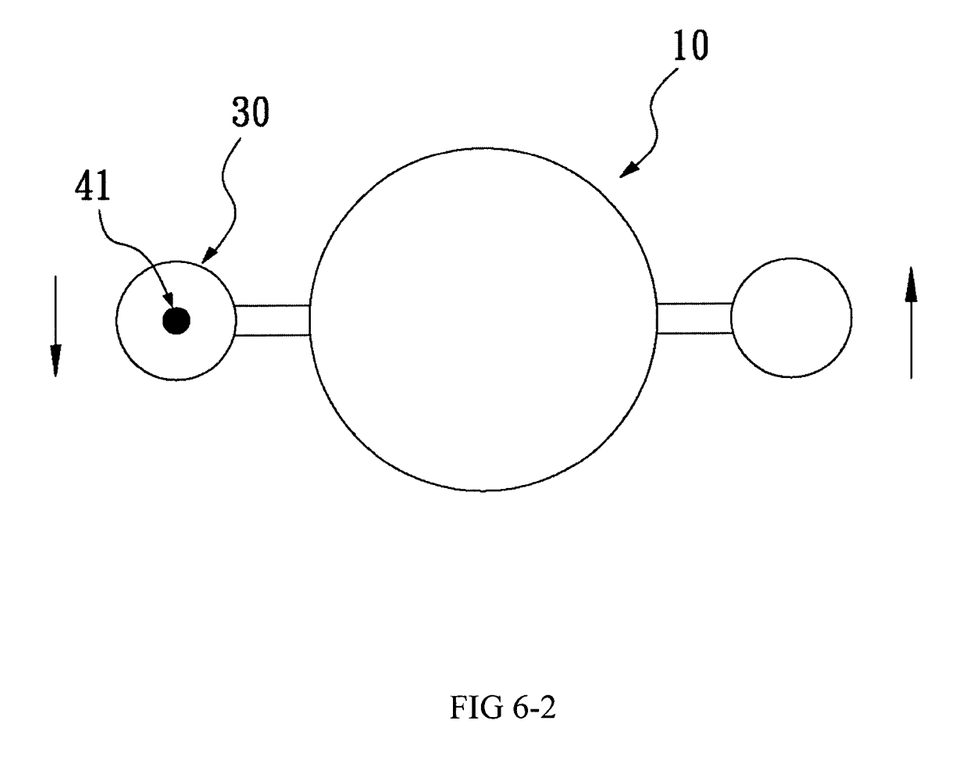

In addition to the above-mentioned deep micro-size contaminant particles, there is another kind of relatively larger size of micro-dust particles which can generate even greater damage to the deep micro-sized circuit of the wafer. The damage caused by micro-dust particles is generated in the batch-type ion implanter. Since the batch-type ion-implanter utilizes rotating disk system at high-speed rotation to carry wafer, the wafer surface, after bombarding at high speed with the micro-dust, forms either the damaged marks similar to scrape or bullet scars, or micro-dust adhesives as shown in FIG. 2-1 through FIG. 2-3 and FIG. 3-1 through FIG. 3-6. FIG. 2-1 through FIG. 2-3 are the result of testing wafer and photographs taken by the use of dark-view method utilizing testing apparatus before and after performing ion implantation test by the use of the method of the prior art, and the testing conditions are as follows:

Conditions for ion implantation:
Implanted ion: Arsenic;
Implantation energy: 15 keV;
Implanted ion dosage: 2E15;
Ion beam current: 20 mA;
Inclined angle of Implantation: 42 degree;
Rotating speed of the rotating disk: 400 RPM;
Rotating direction of the rotating disk: with wafer surface facing the micro-dust;
Wafer under testing: 12-inch wafer having an 8000A-thick-layer of photo resist applied thereon.

Testing apparatus: wafer defect testing instrument KLA Surfscan SP1 for inspecting the distribution of the micro-dust, having size greater than 1 μm, on the wafer surface.

FIG. 2-1 is the result of testing wafer and photographs taken by the use of dark-view method utilizing testing apparatus before performing ion implantation test by the use of the method of the prior art. As shown in FIG. 2-1, the result tested by the apparatus shows that there are relatively small defects at 18 spots. FIG. 2-2 is the result of testing wafer and photographs taken by the use of dark-view method utilizing testing apparatus after performing ion implantation test by the use of the way the wafer surface is facing the micro-dust by the method of the prior art. As shown in FIG. 2-2, these defects appear white bright dots in dark-view, and the result tested by the apparatus shows that there are evident defects at 185 spots that is much greater that those before performing ion implantation test. FIG. 2-3 is an enlarged photograph of FIG. 2-2. FIG. 3-1 is the result of observation and photograph taken of a bright-dot area in FIG. 2-3 utilizing bright-view and a 10×50 magnification. As shown in FIG. 3-1, one can observe the damage marks similar to bullet scars at two spots on the wafer surface. FIG. 3-2 is the result of observation and photograph taken at the same location of observation as that of in FIG. 3-1 utilizing bright-view and a relatively lower magnification. As shown in FIG. 3-2, one can observe that there is another damaged mark, which is generated after being bombarded by the micro-dust particles and which is similar to a scraped mark, below the damaged marks that are similar to bullet scars at two spots on the wafer surface. FIG. 3-3 is the result of observation and photograph taken of other bright-dot area of FIG. 2-3 utilizing bright-view and a 10×10 magnification. As shown in FIG. 3-3, one can observe the damaged marks similar to bullet scars at two spots and a stripe of damaged mark similar to scraped mark on the wafer surface. These scars or marks are generated after being bombarded by the micro-dust particles. FIG. 3-4 is the result of observation and photograph taken at the scraped marks similar to those shown in FIG. 3-3 utilizing bright-view and a 10×50 magnification, while FIG. 3-5 is the result of observation and photograph taken of another bright-dot area of FIG. 2-3 utilizing bright-view and a 10×100 magnification. As shown in FIG. 3-4 and FIG. 3-5, one can observe the damaged marks similar to bullet scars on the wafer surface. FIG. 3-6 is the result of observation and photograph taken of further another bright-dot area of FIG. 2-3 utilizing bright-view and a 10×20 magnification. As shown in FIG. 3-6, one can observe the damaged marks at three spots similar to bullet scars on the wafer surface after being bombarded by the micro-dust particles.

Observing from FIG. 2-1 through FIG. 2-3 and FIG. 3-1 through FIG. 3-6, one can understand that the wafer carried by the rotating disk system of the batch-type ion implanter will be subjected to prominent and serious damage if it has its implanting surface face the micro-dust during the high-speed rotation.

SUMMARY OF THE INVENTION

In light of the disadvantages of the prior arts, the invention provides a method for preventing the wafer surface from being bombarded by the micro-dust particles that aims to ameliorate at least some of the disadvantages of the prior art or to provide a useful alternative.

The objective of the invention is to provide a method for preventing the wafer surface from being bombarded by the micro-dust particles to resolve the problem of causing defective wafer surface that is subjected to the bombardment of the micro-dust particles due to the above-mentioned batch-type ion implantation. The method, by accommodating flexibly and in mobile way to adjust the rotating direction of the rotating disk, makes ion implanting wafer surface, having the deep micro-size circuit structure desired to form, constantly avoid being bombarded by the micro-dust particles.

Normally, in the manufacturing process of semiconductor IC circuit, in order to avoid the channeling effect or there is a need to have a large angle of ion implantation, the direction of ion beam and the normal-line direction of the wafer surface are not in parallel and will form an inclined angle. One can define a positive inclined angle of ion implantation as the inclined angle of the ion beam when the normal direction of the ion beam orients in counter-clockwise direction. Similarly, one can also define a negative inclined angle of ion implantation as the inclined angle of the ion beam when the normal direction of the ion beam orients in clockwise direction. A rule of thumb is also set that the rotating direction of the rotating disk system is observed in the opposite ion source direction. Based on these definitions and rule, the method of the invention can be depicted as follows: adjusting the rotating direction of the rotating disk system into clockwise direction when one performs ion implantation in positive inclined angle, and adjusting the rotating direction of the rotating disk system into counter-clockwise direction when one performs ion implantation in negative inclined angle. In this way, one can make ion implanting wafer surface avoid being bombarded by the micro-dust particles to achieve the objective of resolving the problem of causing defective wafer surface that is subjected to the bombardment of the micro-dust particles due to the above-mentioned batch-type ion implantation.

BRIEF DESCRIPTION OF THE DRAWINGS

The accomplishment of this and other objectives of the invention will become apparent from the following description and its accompanying drawings of which:

FIG. 2-1 is the result of testing wafer and photographs taken by the use of dark-view method utilizing testing apparatus before performing ion implantation test by the use of the method of the prior art;

FIG. 2-2 is the result of testing wafer and photographs taken by the use of dark-view method utilizing testing apparatus after performing ion implantation test by the use of the way the wafer surface is facing the micro-dust by the method of the prior art;

FIG. 2-3 is an enlarged photograph of FIG. 2-2;

FIG. 3-1 is the result of observation and photograph taken of a bright-dot area in FIG. 2-3 utilizing bright-view and a 10×50 magnification;

FIG. 3-2 is the result of observation and photograph taken at the same location of observation as that of in FIG. 3-1 utilizing bright-view and a relatively lower magnification;

FIG. 3-3 is the result of observation and photograph taken of other bright-dot area of FIG. 2-3 utilizing bright-view and a 10×10 magnification.

FIG. 3-4 is the result of observation and photograph taken at the scraped marks similar to those shown in FIG. 3-3 utilizing bright-view and a 10×50 magnification;

FIG. 3-5 is the result of observation and photograph taken of another bright-dot area of FIG. 2-3 utilizing bright-view and a 10×100 magnification;

FIG. 3-6 is the result of observation and photograph taken of further another bright-dot area of FIG. 2-3 utilizing bright-view and a 10×20 magnification;

FIG. 5-1 is a schematic diagram showing the relationship between the wafer normal line and the ion beam when the ion is implanted at a positive inclined angle;

FIG. 5-2 is a schematic diagram showing the rotating direction of the rotating disk by the use of the method of the invention for the ion implantation at a positive inclined angle;

FIG. 6-1 is a schematic diagram showing the relationship between the wafer normal line and the ion beam when the ion is implanted at a negative inclined angle;

FIG. 6-2 is a schematic diagram showing the rotating direction of the rotating disk by the use of the method of the invention for the ion implantation at a negative inclined angle;

FIG. 7-1 is the result of testing wafer and photographs taken by the use of dark-view method by the use of testing apparatus before performing ion implantation test by making use of the method of the invention; and FIG. 7-2 is the result of testing wafer and photographs taken by the use of dark-view method utilizing testing the same region after performing ion implantation test by the making use of the method of the invention.

DETAILED DESCRIPTION OF THE PREFERRED EMBODIMENT

Figure 4:
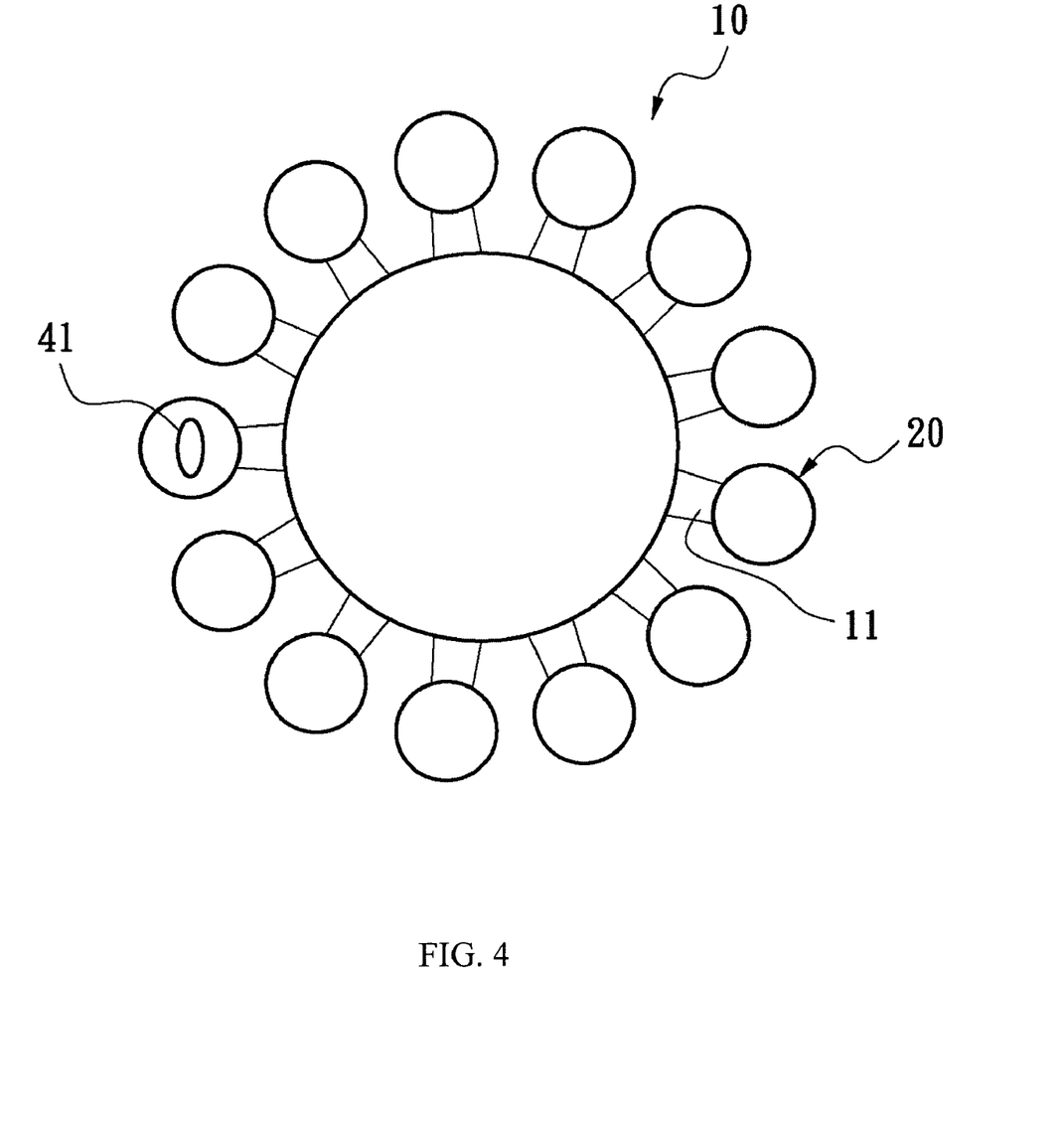
FIG. 4 is a schematic diagram of the rotating disk system of the batch-type ion implanter.

As shown in FIG. 4, the batch-type ion implanter of the prior art not only has a rotating disk system that can rotates at high speed but also has a plurality of wafer supporting pads (20). These wafer supporting pads (20) are respectively mounted on the supporting seats (not shown in the Figure) of the supporting stands (11) extended from the center of the rotating disk (10). Moreover, the wafers are loaded on the plurality of wafer supporting pads (20) of the rotating disk (10), and the ion implantation of a plurality of wafers can be accomplished in one implanting operation. The unidirectional rotation of the rotating disk (10) (as shown in the arcuate arrow symbol) accommodating with one-dimensional linear reciprocating movement (as shown in the bidirectional arrow symbol) can make the ion beam irradiating area (41) sweep up-and-down through the each of the wafer surface. In the meantime, it can also move right-and-left in performing reciprocating motion such that the ions can uniformly implant into each of the wafers.

In the semiconductor IC process, in order to avoid channeling effect, or have desire ion implantation at large angle, the ion beam direction, as it is designed, is not parallel to the wafer surface's normal line direction, instead, they form an inclined angle. As shown in FIG. 5-1, for convenience, implantation at positive inclined angle is defined in such a way that the normal line (31) of the wafer (30) surface inclines to the ion beam (40) in counter-clockwise direction. Similarly, as shown in FIG. 6-1, implantation at negative inclined angle is defined in such a way that the normal line (31) of the wafer (30) surface inclines to the ion beam (40) in clockwise direction. As one observes in a direction opposite to the ion source for the rotating direction of the rotating disk (10), the method for preventing the wafer surface from being bombarded by the micro-dust is as follows: As shown in FIG. 5-2, adjusting the rotating direction of the rotating disk (10) into clockwise direction when it comes to performing an implantation at positive inclined angle, similarly, as shown in FIG. 6-2, adjusting the rotating direction of the rotating disk (10) into counter-clockwise direction when it comes to performing an implantation at negative inclined angle. In this way, the ion-implanting surface of the wafer (30) will never be bombarded by the micro-dust. Consequently, one can achieve the objective of preventing the wafer (30) surface from being bombarded by the micro-dust particles during the batch-type ion implantation process of the invention.

In brief, there is a way to achieve the objective: Load a plurality of wafers on a rotating disk that has a spin axis nearly paralleling to ion beams, and then incline the wafers with an angle of greater than 5 degrees with respect to the ion beams and rotate the rotating disk at a speed greater than 100 rpm. If the wafers are placed in a positive inclined-angle of implantation in such a way that the normal line of the wafer surface inclines to the ion beam in a counter-clockwise direction, then the rotating disk is adjusted to rotate in a clockwise direction. If the wafers are placed in a negative inclined-angle of implantation in such a way that the normal line of the wafer surface inclines to the ion beam in a clockwise direction, the rotating disk is adjusted to rotate in a counter-clockwise direction.

A test is performed under the following test conditions to verify the efficacy of the invention:
Conditions for ion implantation:
Implanted ion: Arsenic;
Implantation energy: 15 keV;
Implanted ion dosage: 2E15;
Ion beam current: 20 mA;
Inclined angle of Implantation: 42 degree;
Rotating speed of the rotating disk: 400 RPM;
Rotating direction of the rotating disk: with wafer surface opposing the micro-dust;
Wafer under testing: 12-inch wafer having an 8000A-thick-layer of photo resist applied thereon.
Testing apparatus: wafer defect testing instrument KLA Surfscan SP1 for inspecting the distribution of the micro-dust, having size greater than 1 μm, on the wafer surface.

In comparing with the test conditions of the invention to those of the prior art, one can find that the only difference is the rotating direction of the rotating disk. In other word, the rotating direction of the rotating disk of the conventional method for performing ion implantation is that the wafer surface faces the micro-dust, while the rotating direction of the rotating disk of the method of the invention for performing ion implantation is that the wafer surface opposes the micro-dust. It is for this difference that one can more prominently verify the efficacy of the invention.

Figure 71:
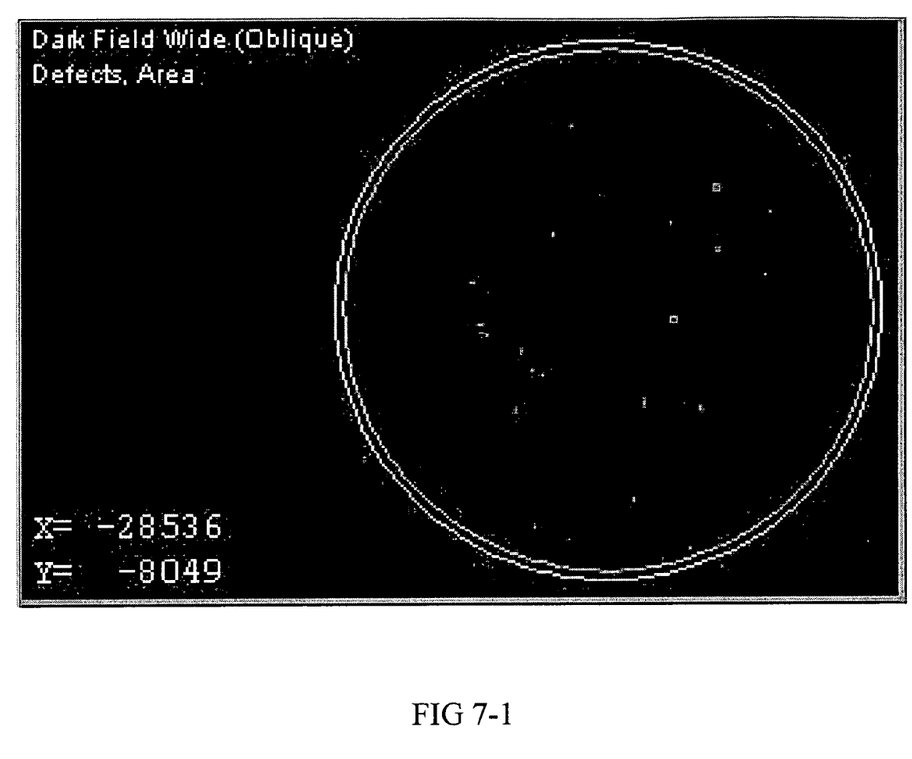
Figure 72:
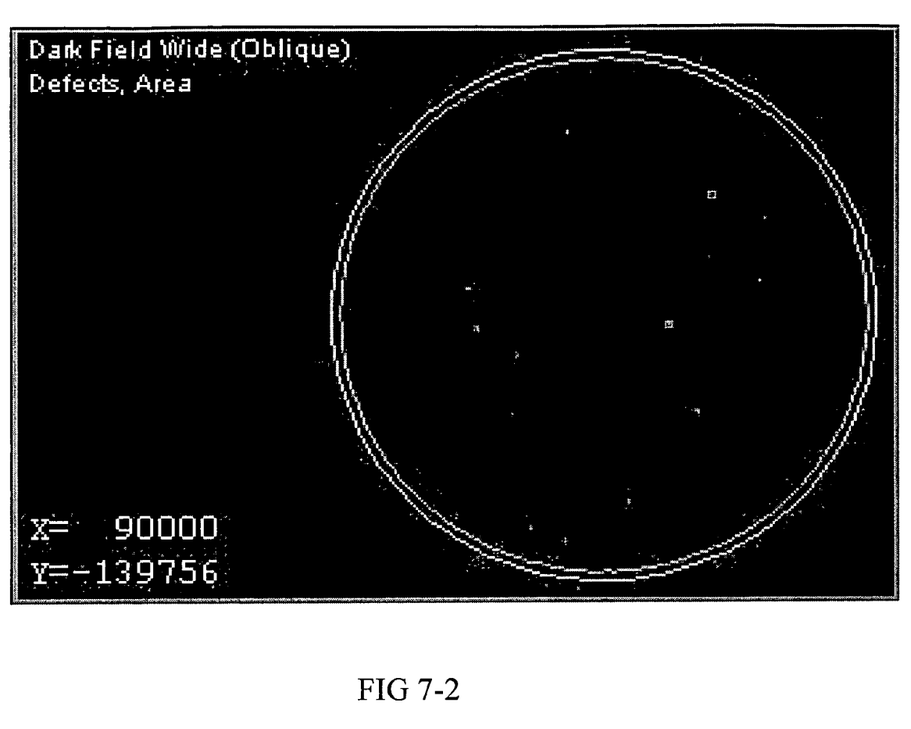

FIG. 7-1 and FIG. 7-2 show the test results. FIG. 7-1 is the result of testing wafer and photographs taken by the use of dark-view method by the use of testing apparatus before performing ion implantation test by making use of the method of the invention. As shown in FIG. 7-1, one can find defect at two spots FIG. 7-2 is the result of testing wafer and photographs taken by the use of dark-view method by the use of testing the same region after performing ion implantation test by making use of the method of the invention. As shown in FIG. 7-2, one can also find defect at two spots at the previous locations. Comparing with the test provided by the prior art that the number of defect in the same area sharply increases from 18 spots of non-obvious defect to 185 spots of obvious defect, the efficacy of the method of the invention is very prominent.

It will become apparent to those people skilled in the art that various modifications and variations can be made to the structure of the invention without departing from the scope or spirit of the invention. In view of the foregoing description, it is intended that all the modifications and variation fall within the scope of the following appended claims and their equivalents.

What is claimed is:

1. A method for preventing wafer surface from bombardment by micro-dust particles during a batch-type ion implantation process the method comprises:
    defining a positive inclined-angle of implantation in such a way that the normal line of the wafer surface inclines to the ion beam in counter-clockwise direction, and a negative inclined-angle of implantation in such a way that the normal line of the wafer surface inclines to the ion beam in clockwise direction;
    defining the rotating direction of the rotating disk with a plurality of wafer loading pads in such a way that one observes in a direction opposite to the ion source;
    determining the adoption of either the positive inclined-angle of batch-type implantation or the negative inclined-angle of batch-type implantation;
    adjusting the rotating direction of the rotating disk and the wafer loading pads into clockwise direction when it comes to performing a implantation at positive inclined angle;
    adjusting the rotating direction of the rotating disk and the wafer loading pads into counter-clockwise direction when it comes to performing an implantation at negative inclined angle; and
    wherein the ion implanting surface of the wafer keep from the bombardment by the micro-dust particles during the rotation of the rotating disk system and the wafer loading pads when the batch-type ion beam is implanted into the wafer surface.

2. A method for preventing wafer surface from bombardment by micro-dust particles during the ion implantation process, comprising the steps of: defining a positive inclined-angle of implantation in such a way that the normal line of the wafer surface inclines to the ion beam in counter-clockwise direction, and a negative inclined-angle of implantation in such a way that the normal line of the wafer surface inclines to the ion beam in clockwise direction;
    loading a plurality of wafers on a rotating disk that has a spin axis nearly parallelling to ion beams;
    inclining the wafers with an angle of greater than 5 degrees with respect to the ion beams; and
    rotating the rotating disk at a speed greater than 100 rpm.

3. The method of claim 2 wherein the wafers are placed in a positive inclined-angle of implantation in such a way that the normal line of the wafer surface inclines to the ion beam in a counter-clockwise direction, then the rotating disk is adjusted to rotate in a clockwise direction.

4. The method of claim 2 wherein the wafers are placed in a negative inclined-angle of implantation in such a way that the normal line of the wafer surface inclines to the ion beam in a clockwise direction, then the rotating disk is adjusted to rotate in a counter-clockwise direction.

* * * * *